(12) United States Patent
Kim et al.

(10) Patent No.: US 9,412,303 B2
(45) Date of Patent: Aug. 9, 2016

(54) REDUCED OFF CURRENT SWITCHING TRANSISTOR IN AN ORGANIC LIGHT-EMITTING DIODE DISPLAY DEVICE

(71) Applicant: LG Display Co., Ltd., Seoul (KR)

(72) Inventors: Junghyeon Kim, Goyang-si (KR); Hyungjin Bang, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/740,564

(22) Filed: Jun. 16, 2015

(65) Prior Publication Data

US 2015/0371589 A1  Dec. 24, 2015

(30) Foreign Application Priority Data

Jun. 20, 2014 (KR) ................. 10-2014-0076096

(51) Int. Cl.
*H01L 29/04* (2006.01)
*G09G 3/32* (2016.01)
*H01L 27/12* (2006.01)

(52) U.S. Cl.
CPC ............. *G09G 3/3258* (2013.01); *G09G 3/325* (2013.01); *G09G 3/3208* (2013.01); *G09G 3/3233* (2013.01); *H01L 27/1225* (2013.01); *H01L 27/1229* (2013.01); *H01L 27/1251* (2013.01); *G09G 2300/043* (2013.01); *G09G 2300/0417* (2013.01); *G09G 2300/0819* (2013.01); *G09G 2300/0842* (2013.01); *G09G 2300/0852* (2013.01); *G09G 2300/0861* (2013.01); *G09G 2310/0262* (2013.01); *G09G 2310/06* (2013.01); *G09G 2320/0247* (2013.01); *G09G 2320/0252* (2013.01); *G09G 2320/043* (2013.01); *G09G 2330/021* (2013.01); *G09G 2340/0435* (2013.01)

(58) Field of Classification Search
CPC ..... G09G 3/3208; G09G 3/3233; G09G 3/325; G09G 3/3258
USPC ........................................................... 257/59
See application file for complete search history.

(56) References Cited

U.S. PATENT DOCUMENTS

| 9,129,927 | B2 | 9/2015 | Gupta et al. | |
|---|---|---|---|---|
| 2003/0067424 | A1* | 4/2003 | Akimoto | G09G 3/3233 345/55 |
| 2005/0176194 | A1* | 8/2005 | Sasaki | H01L 21/8221 438/197 |
| 2007/0188089 | A1* | 8/2007 | Choi | H01L 27/1229 313/506 |
| 2011/0115839 | A1 | 5/2011 | Takahashi et al. | |

(Continued)

FOREIGN PATENT DOCUMENTS

EP  2911201 A1  8/2015

OTHER PUBLICATIONS

European Extended Search Report, European Application No. 15172514.0, Oct. 29, 2015, 11 pages.

*Primary Examiner* — Matthew Gordon
(74) *Attorney, Agent, or Firm* — Fenwick & West LLP

(57) ABSTRACT

An active matrix organic light emitting diode (OLED) display device includes an array of pixels, each pixel including an OLED, a driving transistor (DT) coupled to drive current through the OLED, a storage capacitor, and a scanning transistor (ST) coupled to control charge on the storage capacitor corresponding to a data voltage for said pixel. The display device also includes a timing controller configured to control the ST of each pixel to update the charge stored on the storage capacitor of each pixel at a frame rate including at least one frequency within a range of 1-10 Hertz (Hz).

19 Claims, 14 Drawing Sheets

(56) References Cited

U.S. PATENT DOCUMENTS

| | | | |
|---|---|---|---|
| 2013/0146866 A1* | 6/2013 | Kitagawa | H01L 27/1225 257/43 |
| 2014/0152630 A1 | 6/2014 | Koyama | |
| 2015/0008395 A1* | 1/2015 | Yoon | H01L 27/1251 257/40 |
| 2015/0054799 A1 | 2/2015 | Chang et al. | |
| 2015/0055047 A1 | 2/2015 | Chang et al. | |
| 2015/0055051 A1 | 2/2015 | Osawa et al. | |

* cited by examiner

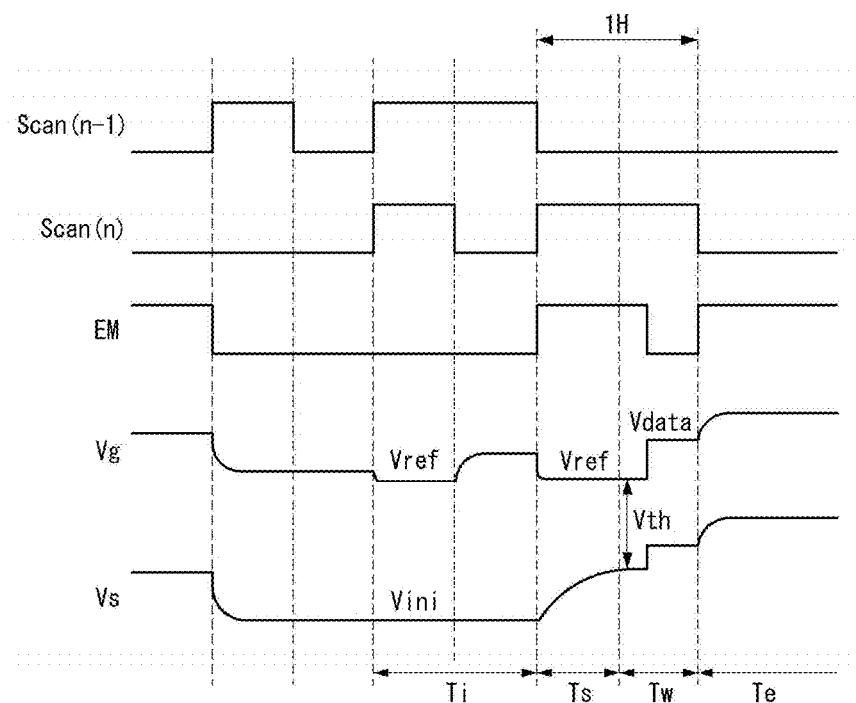

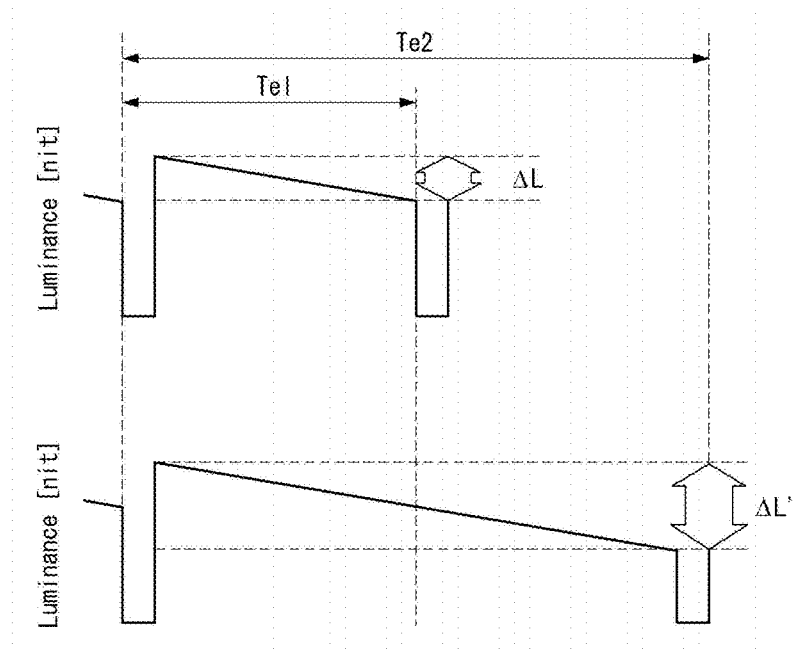

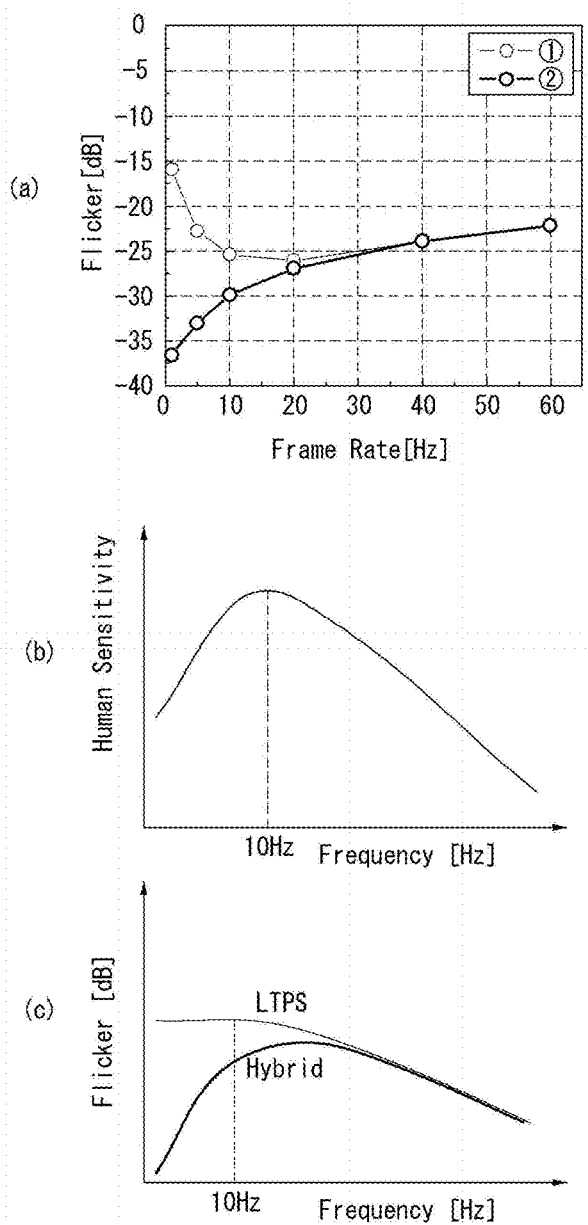

REDUCED OFF CURRENT SWITCHING TRANSISTOR IN AN ORGANIC LIGHT-EMITTING DIODE DISPLAY DEVICE

CROSS-REFERENCE TO RELATED APPLICATION

This application claims the priority benefit of Korean Patent Application No. 10-2014-0076096 filed on Jun. 20, 2014, which is incorporated herein by reference for all purposes as if fully set forth herein.

BACKGROUND OF THE INVENTION

1. Field of the Invention

The present invention relates to an organic light-emitting diode display device.

2. Discussion of the Related Art

A Flat Panel Display (FPD) is being widely used in portable computers, such as laptop computers and PDAs, and handheld telephone terminals as well as in the monitors of desktop computers due to advantages of a small size and light weight. Such an FPD may include a Liquid Crystal Display (LCD), a Plasma Display Panel (PDP), a Field Emission Display (FED), and an Organic Light Emitting Diode Display (hereinafter referred to as an OLED device).

An OLED device is advantageous in that it has fast response speed, can represent luminance having high emission efficiency, and has a wide viewing angle. Owing to such many advantages, the OLED device is being used in various fields, such as portable displays including mobile phones and handheld electronic watches as well as large-screen display devices. Display devices used in various fields have different requirements, such as consumption power and reliability of driving suitable for the characteristics of their application fields. The pixel of a conventional OLED device does not suggest a functional structure corresponding to various requirements.

SUMMARY OF THE INVENTION

An embodiment of the present invention is directed to the provision of an OLED device capable of satisfying various requirements depending on the characteristics of a field in which a display device is used.

An embodiment of the present invention is directed to the provision of an active matrix OLED display device including an array of pixels, each pixel including an OLED, a driving transistor (DT) coupled to drive current through the OLED, a storage capacitor, and a scanning transistor (ST) coupled to control charge on the storage capacitor corresponding to a data voltage for said pixel. The display device also includes a timing controller configured to control the ST of each pixel to update the charge stored on the storage capacitor of each pixel at a frame rate including at least one frequency within a range of 1-10 Hertz (Hz).

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 3 is a timing diagram illustrating that the OLED device is driven in accordance with an embodiment of the present invention.

FIG. 5 is a diagram illustrating a change of luminance depending on a frame rate.

FIG. 6 is a diagram illustrating a change of a flicker depending on a frame rate.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 1:
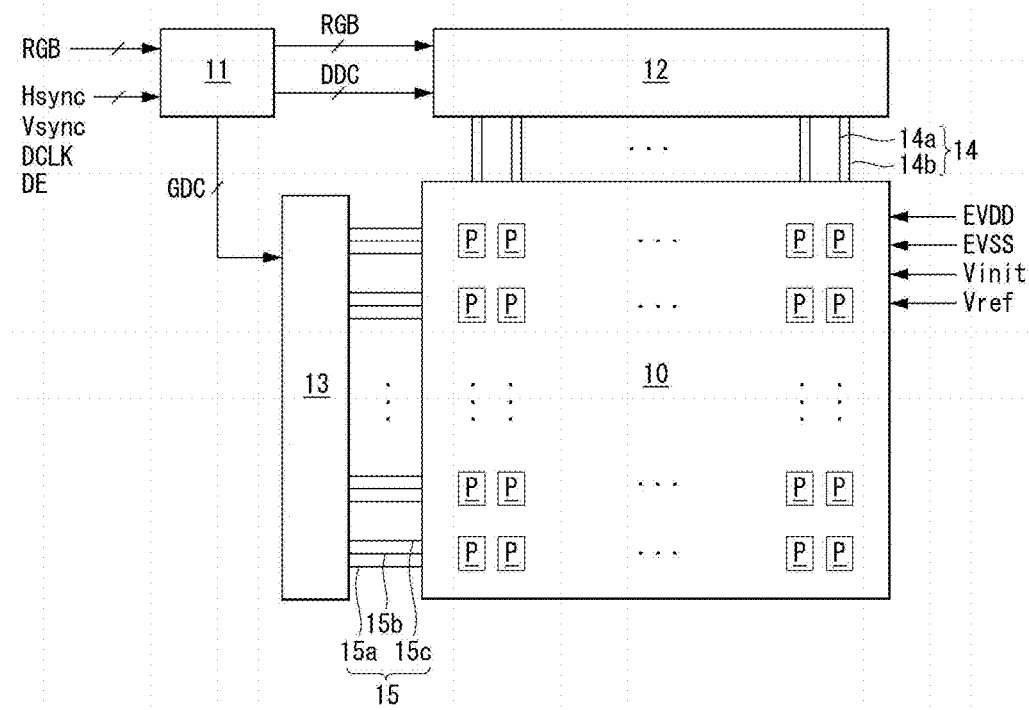
FIG. 1 is a diagram illustrating an OLED device in accordance with an embodiment of the present invention.

FIG. 1 is a diagram illustrating an OLED device in accordance with an embodiment of the present invention.

Referring to FIG. 1, the OLED device in accordance with an embodiment of the present invention may include a display panel 10 in which pixels P are arranged in a matrix form, a data driving circuit 12, a gate driving circuit 13, and a timing controller 11.

The display panel 10 includes a plurality of the pixels P and represents an image based on gray levels displayed by the respective pixels P. A plurality of the pixels P is arranged in each of horizontal lines at specific intervals and disposed in an active matrix form within the display panel 10.

In this case, each of the pixels P is disposed in an area in which a data line unit 14 and a plurality of gate line units 15 orthogonal to each other are intersected. Each of the data line units 14 connected to the pixels P may include an initialization line 14a and a data line 14b. Each of the gate line units 15 connected to the pixels P may include a first scan line 15a, a second scan line 15b, and an emission line 15c.

Figure 2:
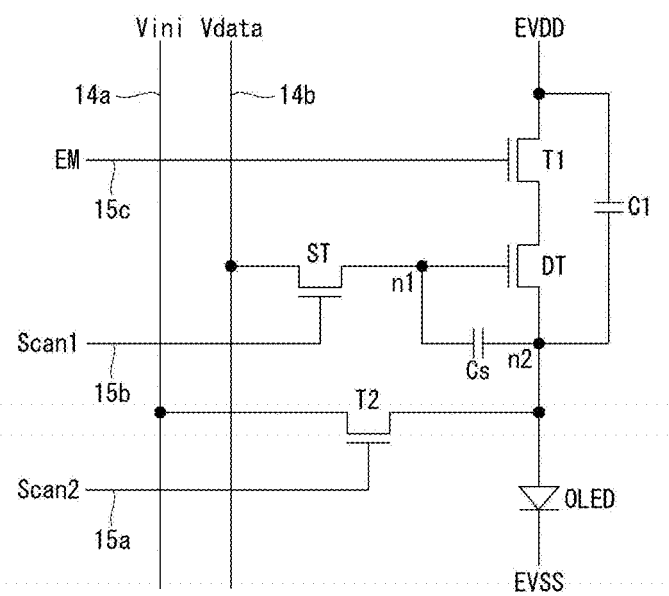
FIG. 2 is a diagram illustrating an embodiment of a pixel included in the OLED device in accordance with an embodiment of the present invention.

Furthermore, each of the pixels P may include an OLED, a driving transistor DT, a switching transistor ST, first and second transistors T1 and T2, a storage capacitor Cs, and an auxiliary capacitor C1, as illustrated in FIG. 2.

The timing controller 11 functions to control driving timing of the data driving circuit 12 and the gate driving circuit 13. To this end, the timing controller 11 may rearrange external digital video data RGB according to resolution of the display panel 10 and supply the rearranged video data to the data driving circuit 12. Furthermore, the timing controller 11 generates a data control signal DDC for controlling operating timing of the data driving circuit 12 and a gate control signal GDC for controlling operating timing of the gate driving circuit 13 based on timing signals, such as a vertical sync signal Vsync, a horizontal sync signal Hsync, a dot clock signal DCLK, and a data enable signal DE.

Consequently, the timing controller 11 controls the frame rate, or rate at which the image projected by each pixel in the display is updated based on the charge maintained on the storage capacitor, as dictated by the data driving circuit 12 described immediately below. Thus, if for example the timing controller 11 is configured to update the pixels at a frame rate of 1 Hz, then the timing controller 11 will cause the images projected by all of the pixels in the display once per second.

The data driving circuit 12 functions to drive the data line unit 14. To this end, the data driving circuit 12 may convert the digital video data RGB, received from the timing controller 11, into an analog data voltage in response to the data control signal DDC and supply the converted analog data voltage to the data lines 14.

The gate driving circuit 13 functions to drive the gate line units 15. To this end, the gate driving circuit 13 may generate a scan signal, an emission control signal, and an initialization signal in response to the gate control signal GDC. The gate driving circuit 13 supplies the scan signal to the scan lines 15a in a line-sequential manner, supplies the emission control signal to the emission lines 15b in a line-sequential manner, and supplies the initialization signal to the initialization lines 15c in a line-sequential manner.

FIG. 2 illustrates an example of the pixel P illustrated in FIG. 1 and illustrates one of the pixels P in the horizontal line.

Referring to FIG. 2, the pixel P in accordance with an embodiment of the present invention may include the OLED, the driving transistor DT, the switching transistor ST, the first and the second transistors T1 and T2, the storage capacitor Cs, and the auxiliary capacitor C1.

The OLED emits light in response to a driving current supplied by the driving transistor DT. A multi-layer organic compound layer is formed between the anode electrode and cathode electrode of the OLED. The organic compound layer includes a Hole Injection Layer (HIL), a Hole Transport Layer (HTL), an emission Layer (EML), an Electron Transport Layer (ETL), and an Electron Injection Layer (EIL). The anode electrode of the OLED is connected to the source electrode of the driving transistor DT, and the cathode electrode thereof is connected to a low-voltage driving voltage EVSS.

The driving transistor DT controls a driving current applied to the OLED using its own gate-source voltage. To this end, the gate electrode of the driving transistor DT may be connected to an input terminal for a data voltage Vdata, the drain electrode of the driving transistor DT may be connected to an input terminal for a driving voltage EVDD, and the source electrode of the driving transistor DT may be connected to the low-voltage driving voltage EVSS.

The first transistor T1 controls a current path between the input terminal for the driving voltage EVDD and the driving transistor DT in response to an emission control signal EM. To this end, the gate electrode of the first transistor T1 may be connected to the emission line 15c, the drain electrode of the first transistor T1 may be connected to the input terminal for the driving voltage EVDD, and the source electrode of the first transistor T1 may be connected to the driving transistor DT.

The second transistor T2 supplies a second node n2 with an initialization voltage Vini, supplied by the initialization line 14a, in response to a second scan signal Scan2, that is, the scan signal of an $(n-1)^{th}$ horizontal line. To this end, the gate electrode of the second transistor T2 may be connected to an $(n-1)^{th}$ scan line 15a, the drain electrode of the second transistor T2 may be connected to the initialization line 14a, and the source electrode of the second transistor T2 may be connected to the second node n2.

The driving transistor DT and the first and the second transistors T1 and T2 are formed of transistors using Low-Temperature PolySilicon (LTPS). The LTPS transistor can implement a high-performance display device because it has a high electron mobility and excellent reliability.

The switching transistor ST supplies the driving transistor DT with a reference voltage Vref or the data voltage Vdata, supplied by the data line 14b, in response to a first scan signal Scan1, that is, the scan signal of an $n^{th}$ horizontal line. To this end, the gate electrode of the switching transistor ST may be connected to the first scan line Scan1, the drain electrode of the switching transistor ST may be connected to the data line 14b, and the source electrode of the switching transistor ST may be connected to the driving transistor DT.

The switching transistor ST is formed of an oxide transistor using an oxide semiconductor, such as zinc oxide (ZnO) or GaInZnO (GIZO), as an active layer. Since the oxide transistor has a low off current, the switching transistor ST using the oxide transistor can prevent the gate-source potential of the driving transistor DT from being reduced due to the off current. Accordingly, even in the case of low-frequency driving, a flicker can be prevented from occurring due to a reduction in the gate-source potential of the driving transistor DT attributable to the off current.

The storage capacitor Cs maintains the data voltage Vdata provided by the data line 14b for one frame so that the driving transistor DT maintains a constant voltage. To this end, the storage capacitor Cs may be connected to the gate electrode and source electrode of the driving transistor DT. The auxiliary capacitor C1 is connected in series to the storage capacitor Cs in the second node n2, thereby improving efficiency of the driving voltage Vdata.

An operation of the pixel P configured as described above is described below. FIG. 3 is a waveform diagram illustrating the signals EM, SCAN, INIT, and DATA applied to the pixel P of FIG. 2 and a change of the potential of the gate electrode and source electrode of the driving transistor DT.

Referring to FIG. 3, an operation of the pixel P in accordance with an embodiment of the present invention may include an initialization period Ti in which the gate-source potential of the driving transistor DT is initialized to a specific voltage, a sampling period Ts in which the threshold voltage Vth of the driving transistor DT is detected and stored, a writing period Tw in which the data voltage Vdata is applied, and an emission period Te in which a driving current applied to the OLED is compensated for regardless of the threshold voltage Vth using the threshold voltage Vth and the data voltage Vdata.

In the initialization period Ti, the second transistor T2 supplies the second node n2 with the initialization voltage Vini, supplied by the initialization line 14a, in response to the second scan signal Scan2. Accordingly, the source voltage Vs of the driving transistor DT, that is, the voltage of the second node n2, has the same potential as the initialization voltage Vini. Furthermore, the switching transistor ST supplies the first node n1 of the gate electrode of the driving transistor DT with the reference voltage Vref, supplied by the data line 14b, in response to the first scan signal Scan1. Accordingly, the gate voltage Vg of the driving transistor DT, that is, the voltage of the first node n1, has the same potential as the reference voltage Vref.

In the initialization period Ti, the initialization voltage Vini supplied to the second node n2 initializes the pixel P to a specific level. In this case, the initialization voltage Vini is set as a voltage value smaller than the operating voltage of the OLED so that the OLED does not emit light. For example, the initialization voltage Vini may be set as a value of −1 to +1 V.

In the sampling period Ts, the switching transistor ST supplies the first node n1 with the reference voltage Vref, supplied by the data line 14b, in response to the first scan signal Scan1. Furthermore, the first transistor T1 supplies the driving voltage EVDD to the driving transistor DT in response to the emission control signal EM. In this case, the voltage Vg of the gate electrode of the driving transistor DT maintains the reference voltage Vref. Furthermore, when the second node n2 is in a floating state, an electric current flowing from the input terminal for the driving voltage EVDD to the first transistor T1 and the driving transistor DT is accumulated in a voltage at the second node n2. The voltage raised in the sampling period Ts is saturated to a voltage having an amount corresponding to a difference between the reference voltage Vref and the threshold voltage Vth of the driving transistor DT. That is, the potential between the gate and source electrodes of the driving transistor DT is the same as the threshold voltage Vth of the driving transistor DT through the sampling period Ts.

In the writing period Tw, the first and the second transistors T1 and T2 are turned off. Furthermore, when the switching transistor ST is turned on, the data voltage Vdata supplied by the data line 14b is supplied to the first node n1. In this case, a voltage at the second node n2 in the floating state is increased or decreased because the storage capacitor Cs and the auxiliary capacitor C1 are coupled at their ratio.

In the emission period Te, the second transistor T2 and the switching transistor ST are turned off, and the first transistor T1 is turned on. In the emission period Te, the data voltage Vdata stored in the storage capacitor Cs is supplied to the OLED. Accordingly, the OLED emits light with luminance proportional to the data voltage Vdata. In this case, an electric current flows in the driving transistor DT by the voltages of the first node n1 and second node 2 determined in the writing period Tw. Accordingly, a desired electric current is supplied to the OLED, and the OLED device may control its luminance based on the data voltage Vdata.

In the process of the OLED emitting light, a voltage drop of the storage capacitor Cs can be suppressed because the switching transistor ST is formed of an oxide semiconductor transistor having a low off current.

The off current of the switching transistor ST is an electric current that flows from the drain electrode of the switching transistor ST to the source electrode in the state in which the switching transistor ST has been turned off because the gate-source potential of the switching transistor ST is less than the threshold voltage Vth. The off current of the switching transistor ST causes a voltage drop of the storage capacitor Cs. Such a voltage drop of the storage capacitor Cs causes a change ΔVgs of the gate-source potential of the driving transistor DT. The voltage drop of the storage capacitor Cs causes a reduction in the luminance of the OLED because the gate-source potential of the driving transistor DT determines the emission luminance of the OLED. That is, the off current of the switching transistor ST causes a reduction in the luminance of the OLED. If luminance is reduced during one frame period, a flicker phenomenon is generated when a frame is changed due to a difference between the reduced luminance and the initial luminance of a subsequent frame.

Figure 4A:
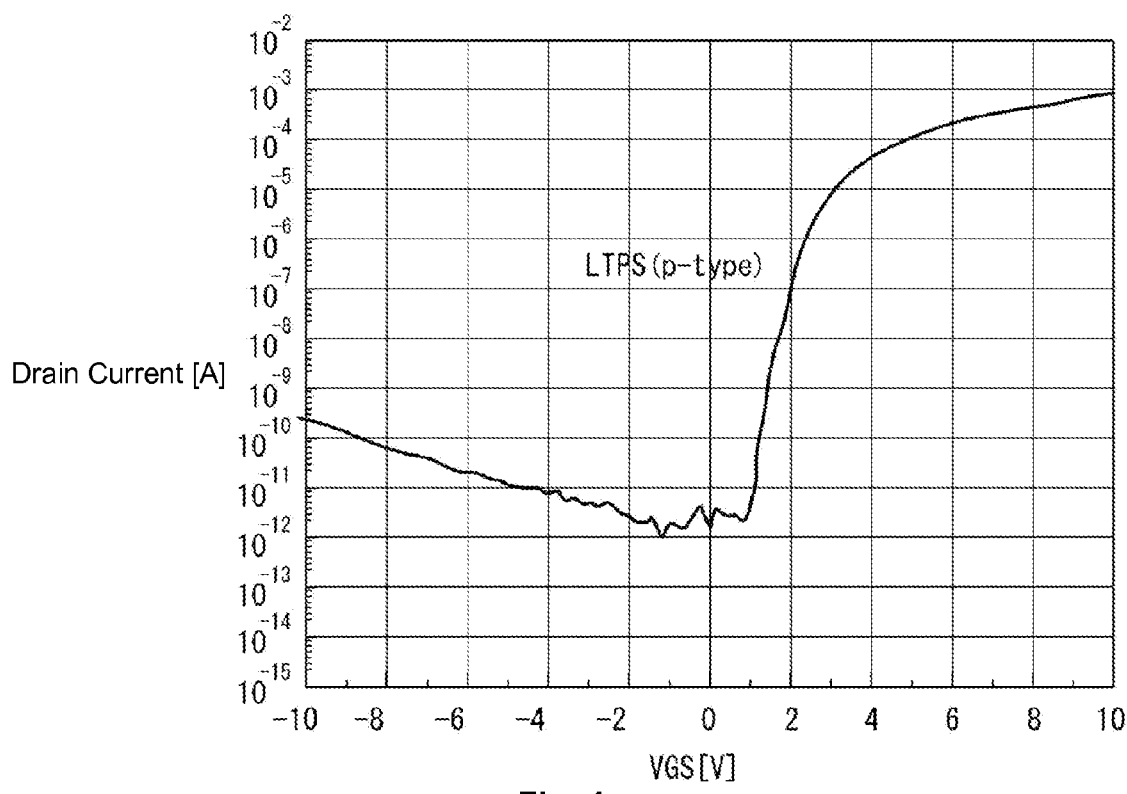
FIGS. 4a and 4b are diagrams illustrating the off currents of a low-temperature polysilicon transistor and oxide semiconductor transistor.
Figure 4B:
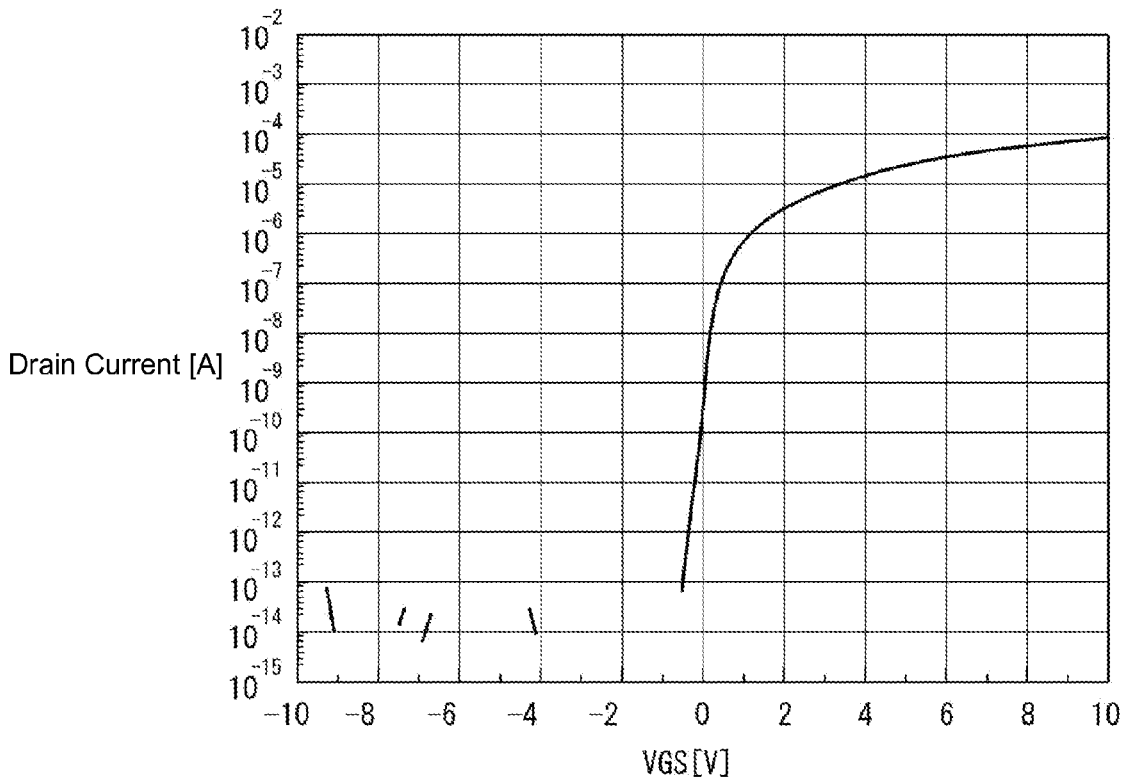

FIG. 4(a) is a diagram illustrating the off current of the LTPS transistor depending on the gate-source potential, and FIG. 4(b) is a diagram illustrating the off current of the oxide semiconductor transistor depending on the gate-source potential. The off current of the oxide semiconductor transistor is very smaller than that of the LIPS transistor and may not be accurately measured in a measurement range or less of measurement equipment. As illustrated in FIG. 4(b), the switching transistor ST according to an embodiment has a very low off current that may be negligible because it is formed of an oxide semiconductor. Accordingly, the OLED device in accordance with an embodiment of the present invention can suppress a flicker phenomenon attributable to the off current.

Accordingly, the OLED device in accordance with an embodiment of the present invention can provide a display device in which a flicker phenomenon is not generated even in the case of low-frequency driving. FIG. 5 is a diagram illustrating a change of luminance between frames depending on the frequency. As illustrate in FIG. 5, an emission period Te2 for low-frequency driving is longer than an emission period Te1 for standard frequency driving. Accordingly, a flicker problem is significantly reduced in low-frequency driving because a change of luminance ΔL'? in low-frequency driving is greater than a change of luminance ΔL in standard frequency driving.

In an embodiment of the present invention, a flicker phenomenon is not generated even in the case of low-frequency driving because the off current of the switching transistor ST is very small and thus a voltage drop of the storage capacitor Cs is very small.

FIG. 6(a) is a diagram illustrating a change of a flicker depending on a driving frequency, that is, a frame rate. FIG. 6(b) is a diagram illustrating a human sensitivity depending on a driving frequency. FIG. 6(c) is a diagram illustrating a change of a flicker that is felt by a person depending on a driving frequency as a result of the integration of FIGS. 6(a) and (b).

In FIGS. 6(a) and (c), a first graph ① illustrates a change of a flicker in a display device in which the switching transistor is made of low-temperature polysilicon, and a second graph ② illustrates a change of a flicker in a display device in which the switching transistor is formed of an oxide semiconductor transistor in accordance with an embodiment of the present invention. As illustrated in FIG. 6(a), in the display device in which the switching transistor is made of low-temperature polysilicon, if a driving frequency is 30 Hz or less, a flicker suddenly increases as the driving frequency decreases. In contrast, in the display device in which the switching transistor ST is formed of the oxide semiconductor transistor, a flicker is decreased as a driving frequency is decreased. A difference of flicker between a first graph ① and second graph ② begins below driving frequency 40 Hz or less. The difference begins to increase in a driving frequency of 20 Hz or less and further increases in a driving frequency of 10 Hz or less. As a result, if the display device in which the switching transistor is made of low-temperature polysilicon is applied to a display device having a driving frequency of 30 Hz or less, a flicker problem is occurred.

However, in the display device in which the switching transistor ST is formed of an oxide semiconductor transistor as in an embodiment of the present invention (or in accordance with an embodiment described with respect to FIG. 8 below), a flicker is rarely generated although low-frequency driving close to a still image is performed.

Furthermore, the human sensitivity is most sensitive in a driving frequency of 10 Hz, as illustrated in FIG. 6(b). From FIG. 6(b), it may be seen that a flicker is suddenly decreased in a driving frequency of 10 Hz or less in the OLED device in accordance with an embodiment of the present invention. The flicker depending on the driving frequency as illustrated FIG. 6(a) may vary on a temperature. For example, as illustrated in FIG. 6(a), at room temperature, the effect in accordance with an embodiment of the present invention may be expected from the driving frequency of 30 Hz or less. In contrast, at high temperature, a difference is generated from a driving frequency having a great change of a flicker between the display device using only low-temperature polysilicon and the display device using an oxide transistor as the switching transistor. For example, at high temperature, a flicker is reduced more in the display device according to an embodiment of the present invention than in the display device using only low-temperature polysilicon from a driving frequency of 60 Hz or less.

As described above, an embodiment of the present invention may be applied to a display device using a low-driving frequency in order to reduce consumption power because a flicker is not generated in a driving frequency having a low frame rate. In particular, an embodiment of the present invention may be applied to a case where a driving frequency is greatly reduced in order to reduce consumption power in portable display devices. For example, in the case of a portable electronic watch, if a display screen is changed for each second, a driving frequency of 1 Hz may be used. In an embodiment of the present invention, a flicker is rarely generated although a driving frequency that is 1 Hz or close to a still image is used. Furthermore, in an embodiment of the present invention, consumption power can be significantly reduced because a driving frequency can be greatly reduced when a still image is displayed as in the standby screen of a portable terminal.

Furthermore, an embodiment of the present invention may be applied to a terminal not requiring a high driving frequency equivalent to a moving image level, such as an E-book, thereby greatly reducing consumption power. Accordingly, the portability of a portable terminal can be improved.

Thus, in one embodiment, a benefit of a display device including pixels including an ST and a DT as described herein is that the pixels of the display device can be driven at a frame rate (or refresh rate) at any frequency between 1-10, inclusive, while only rarely generating flicker. This is advantageous, as it allows for creation of a comparatively static display device that consumes very little power. Additionally, the display device can also be driven normally at a more traditional frame rate such as at or near 60 Hz. As a result, the display device may switch operation as operational needs dictate between a relatively static, low power mode (e.g., 1 Hz frame rate), and a normal frame rate, higher power mode (e.g., 60 Hz frame rate).

Figure 7:
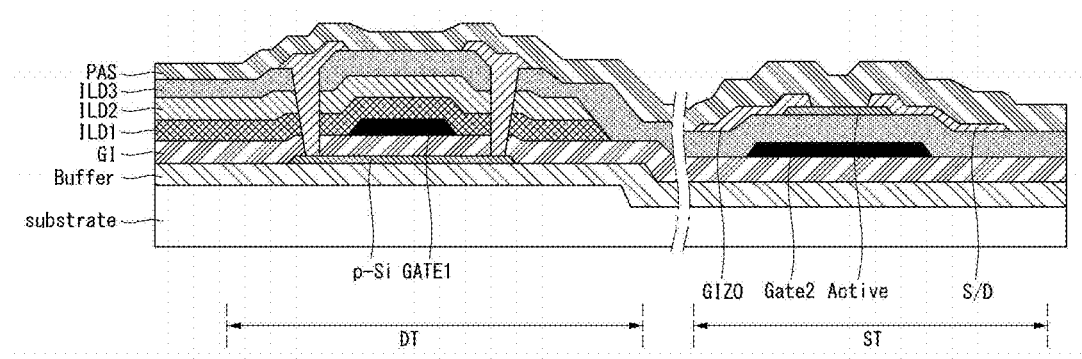
FIG. 7 is a cross-sectional view illustrating the structure of a driving transistor and switching transistor in accordance with an embodiment of the present invention.

FIG. 7 is a cross-sectional view illustrating the structure of the driving transistor DT and switching transistor ST in accordance with an embodiment of the present invention. The structure of the driving transistor DT and switching transistor ST and a method of forming the driving transistor DT and the switching transistor ST are described below with reference to FIG. 7.

A process of forming the driving transistor DT may include forming a buffer layer in a substrate. The buffer layer may be formed of an oxide ($SiO_2$) layer. A low-temperature polysilicon layer p-Si used as the active layer of the driving transistor DT may be formed on the buffer layer. Some region of the low-temperature polysilicon layer p-Si may be implemented into source and drain regions S and D through an ion injection process (also referred to as a charge carrier implantation process or charge carrier doping). A gate insulating layer GI may be formed on the low-temperature polysilicon layer p-Si. The gate insulating layer GI may be formed of an oxide ($SiO_2$) layer. A first gate layer Gate1 may be formed on the gate insulating layer GI. The gate may be made of a metal such as Molybdenum or Aluminum, or an alloy or combination of materials including a metal.

Thereafter, one or more insulating layers (also referred to as interlayer dielectrics or ILDs) may be sequentially formed to cover the first gate layer Gate1. In one implementation, the insulating layers include a first ILD and a second ILD. In another implementation, the insulating layers include a first, a second, and a third ILD. In other implementations, only a single insulation layer may be formed, or more than three insulation layers may be formed. Furthermore, a passivation layer PAS may be formed on the third insulating layer ILD3. Multiple insulating layers can prevent the current characteristics and reliability of transistor from being reduced.

A process of forming the switching transistor ST may include forming a buffer layer in the substrate. A second gate layer Gate2 may be formed on the gate insulating layer GI. The third insulating layer ILD3 (or second ILD2 in an implementation where only two ILDs are used in the DT) may be formed to cover the second gate layer Gate2. An oxide semiconductor layer Active may be formed on the third insulating layer ILD3 (or, again ILD2 depending upon the implementation). The source and drain electrodes S and D may be formed in some region of the oxide semiconductor layer Active. The passivation layer PAS may be formed to cover the source electrode S and the drain electrode D.

Figure 8:
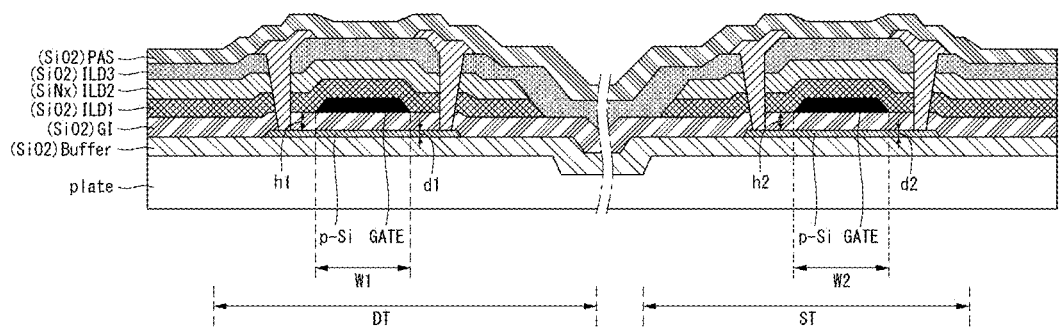
FIG. 8 is a cross-sectional view illustrating the structure of a driving transistor and switching transistor in accordance with another embodiment of the present invention.

FIG. 8 is a cross-sectional view illustrating the structure of the driving transistor DT and switching transistor ST of the OLED device in accordance with another embodiment of the present invention. In the present embodiment, the same elements as those of the aforementioned embodiment are assigned the same reference numerals, and a detailed description thereof is omitted.

Referring to FIG. 8, the OLED device in accordance with another embodiment of the present invention uses low-temperature polysilicon transistors as both the driving transistor DT and the switching transistor ST.

Figure 9:
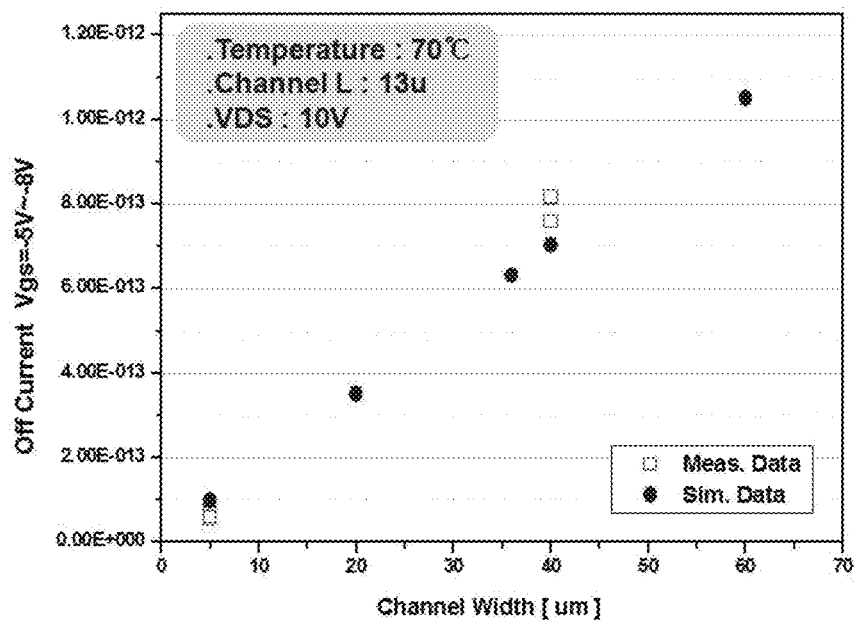
FIG. 9 is a diagram illustrating a change of the off current depending on the channel width of the switching transistor.

The channel width W2 of the switching transistor ST may be 5~15% smaller than the channel width W1 of the driving transistor DT. As illustrated in FIG. 9, the off current of the switching transistor ST and driving transistor DT is proportional to the channel width W2 of the switching transistor ST. Accordingly, in an embodiment of the present invention, the off current of the switching transistor ST can be reduced by setting the channel width W2 of the switching transistor ST smaller than the channel width W1 of the driving transistor DT. The off current of the switching transistor ST is reduced according to a reduction of the channel width W2 of the switching transistor ST, but the channel width W2 of the switching transistor ST may be set 5~15% narrower than the channel width W1 of the driving transistor DT so that reliability of driving is not affected.

Figure 10:
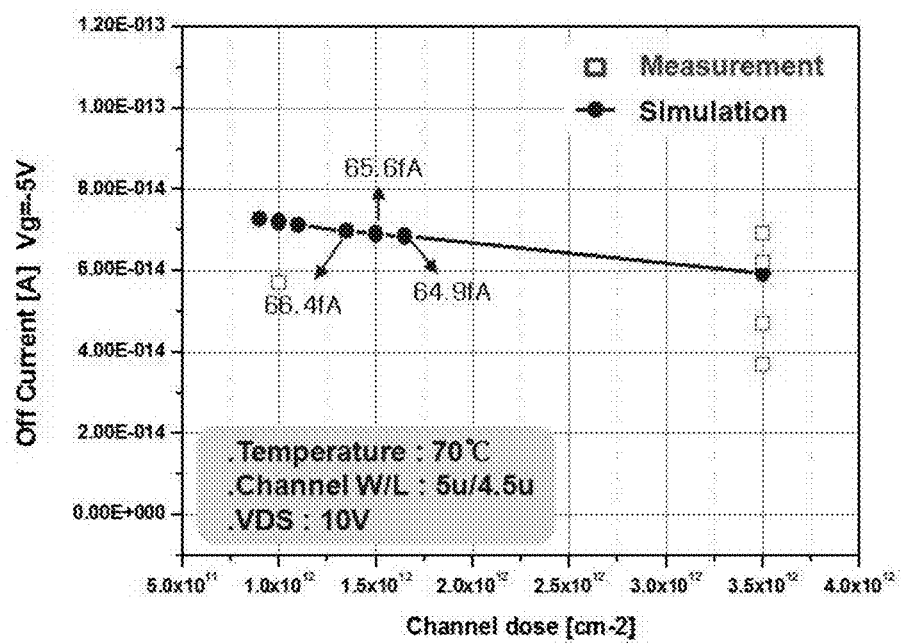
FIG. 10 is a diagram illustrating a change of the off current depending on the channel doping of the switching transistor.

The doping concentration of the active layer p-Si of the switching transistor ST may be 5~15% higher than that of the active layer p-Si of the driving transistor DT. As illustrated in FIG. 10, the off current of the switching transistor ST and driving transistor DT is in inverse proportion to the doping concentration of the switching transistor ST. The reason for this is that if the doping concentration of the active layer p-Si increases, resistance of a PN junction with a Lightly Doped Drain (LDD) region is increased and the off current is decreased. Accordingly, in an embodiment of the present invention, the off current of the switching transistor ST can be reduced by setting the doping concentration of the active layer p-Si of the switching transistor ST higher than the doping concentration of the active layer p-Si of the driving transistor DT. The off current is decreased as the doping concentration of the switching transistor ST is increased, but the doping concentration of the active layer p-Si of the switching transistor ST may be set to be 5~15% higher than that of the active layer p-Si of the driving transistor DT so that reliability of driving is not affected.

Figure 11:
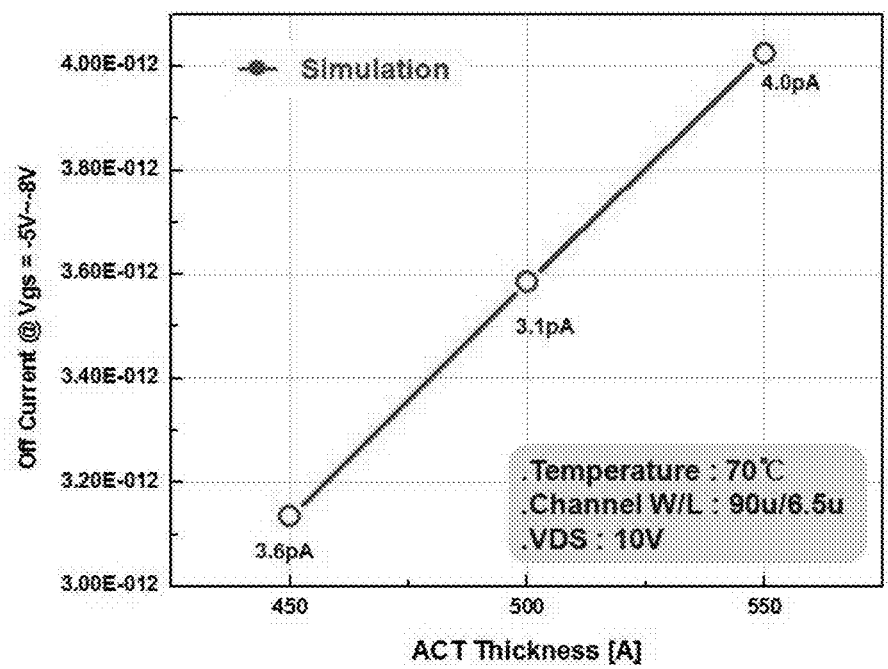
FIG. 11 is a diagram illustrating a change of the off current depending on the thickness of the active layer of the switching transistor.

The thickness d2 of the active layer p-Si of the switching transistor ST may be 5~15% smaller than the thickness d1 of the active layer p-Si of the driving transistor DT. As illustrated in FIG. 11, the off current of the switching transistor ST and driving transistor DT is proportional to the thickness d2 of the active layer p-Si. Accordingly, in an embodiment of the present invention, the off current can be reduced by setting the thickness d2 of the active layer of the switching transistor ST smaller than the thickness d1 of the active layer of the driving transistor DT. The off current is reduced as the thickness d2 of the active layer p-Si of the switching transistor ST is reduced, but the thickness d2 of the active layer p-Si of the switching transistor ST may be 5~15% smaller than the thickness d1 of the active layer p-Si of the driving transistor DT so that reliability of driving is not affected.

Figure 12:
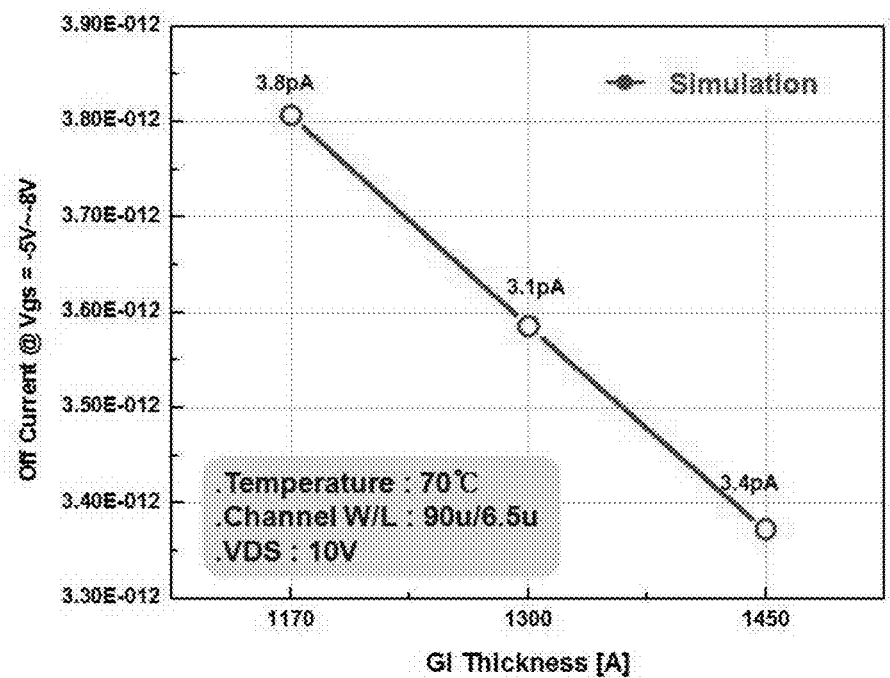
FIG. 12 is a diagram illustrating a change of the off current depending on the thickness of the gate insulating layer of the switching transistor.

The thickness h2 of the gate insulating layer GI of the switching transistor ST may be 5~15% greater than the thickness h1 of the gate insulating layer GI of the driving transistor DT. As illustrated in FIG. 12, the off current of the switching transistor ST and driving transistor DT is in inverse proportion to the thickness of the gate insulating layer GI. Accordingly, in an embodiment of the present invention, the off current can be reduced by setting the thickness h2 of the gate insulating layer GI of the switching transistor ST greater than the thickness h1 of the gate insulating layer GI of the driving transistor DT. The off current is reduced as the thickness h2 of the gate insulating layer GI of the switching transistor ST is increased, but the thickness h2 of the gate insulating layer GI of the switching transistor ST may be 5~15% greater than the thickness h1 of the gate insulating layer GI the driving transistor DT so that reliability of driving is not affected.

Figure 13:
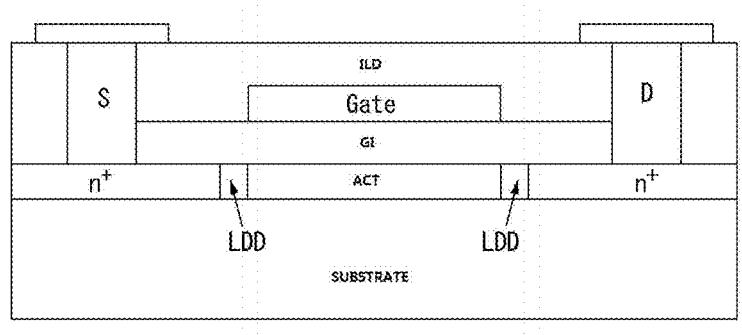
FIG. 13 is a cross-sectional view illustrating an embodiment of the switching transistor.
Figure 15:
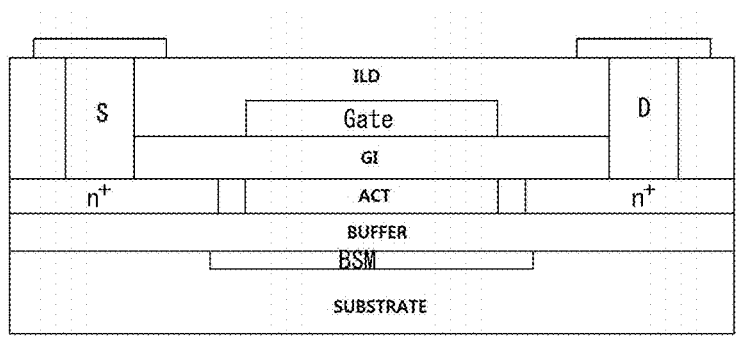
FIG. 15 is a cross-sectional view illustrating another embodiment of the switching transistor.
Figure 17:
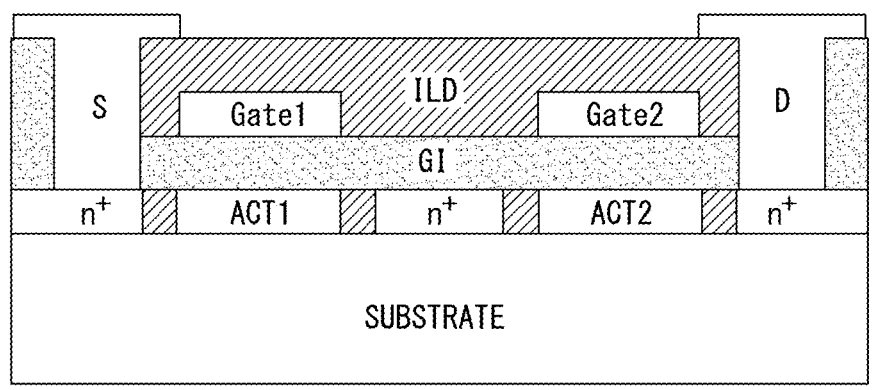
FIG. 17 is a cross-sectional view illustrating yet another embodiment of the switching transistor.

FIGS. 13, 15, and 17 illustrate modification examples of the switching transistor ST using low-temperature polysilicon, an example of which is illustrated in FIG. 8, described above.

Figure 14:
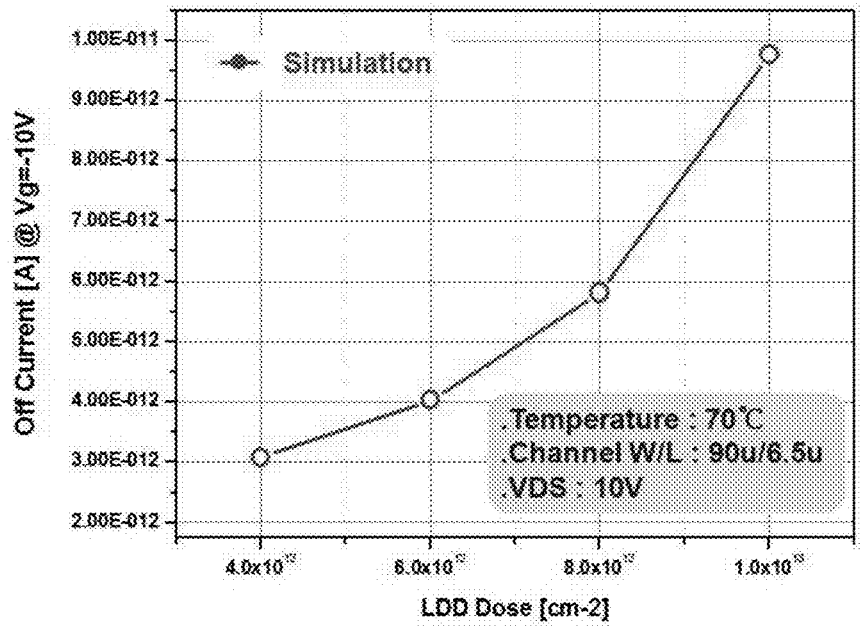
FIG. 14 is a diagram illustrating a change of the off current depending on the doping concentration of the LDD of the switching transistor.

Referring to FIG. 13, in an embodiment of the present invention, the doping concentration of a Lightly Doped Drain (LDD) region in the source and drain of the switching transistor ST (adjacent to the active region labeled ACT in FIG. 13) may be 5~15% lower (e.g., less doping of additional n-type charge carriers) than that of the LDD region in the source and drain of the driving transistor DT (not shown in FIG. 13). As illustrated in FIG. 14, the off current of the switching transistor ST and driving transistor DT is proportional to the doping concentration of the LDD region. The reason for this is that if the doping concentration of the LDD region increases, resistance of a junction with the active layer is reduced and thus the off current also increases. Accordingly, in an embodiment of the present invention, the off current can be reduced by setting the doping concentration of the LDD region of the switching transistor ST lower than that of the LDD region of the driving transistor DT. The off current is reduced as the doping concentration of the LDD region of the switching transistor ST is decreased, but the doping concentration of the LDD region of the switching transistor ST may be 5~15% lower than that of the LDD region of the driving transistor DT so that reliability of driving is not affected.

Figure 16:
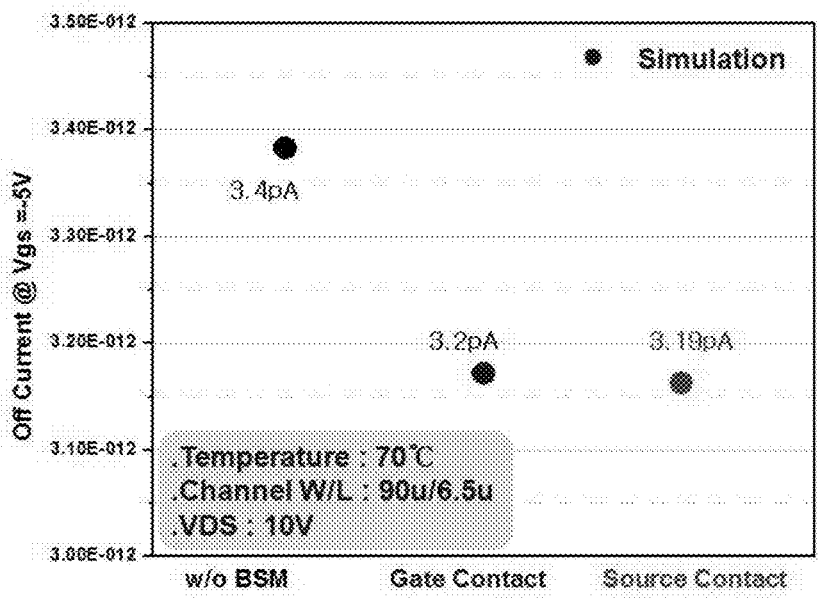
FIG. 16 is a diagram illustrating a change of the off current depending on whether the bottom shield metal of the switching transistor is present or not.

Referring to FIG. 15, the switching transistor ST may further include a Bottom Shield Metal (BSM) layer. The BSM layer is formed under a channel layer with a buffer layer BUFFER interposed between the BSM layer and the channel layer. Although not illustrated, the BSM layer may be electrically connected to a gate Gate or a source/drain S, D. The BSM layer functions to reduce the off current by reducing an illumination effect that may affect the active layer of a device. Furthermore, the BSM layer functions to suppress the generation of carriers that may be introduced into the active layer in the off condition of the transistor due to a field distribution of a contact between the gate Gate and the source S. Accordingly, as illustrated in FIG. 16, the off current of the switching transistor ST further including the BSM layer is reduced 6% or more. That is, the switching transistor ST in accordance with an embodiment of the present invention can further reduce the off current by additionally including the BSM layer.

Figure 18:
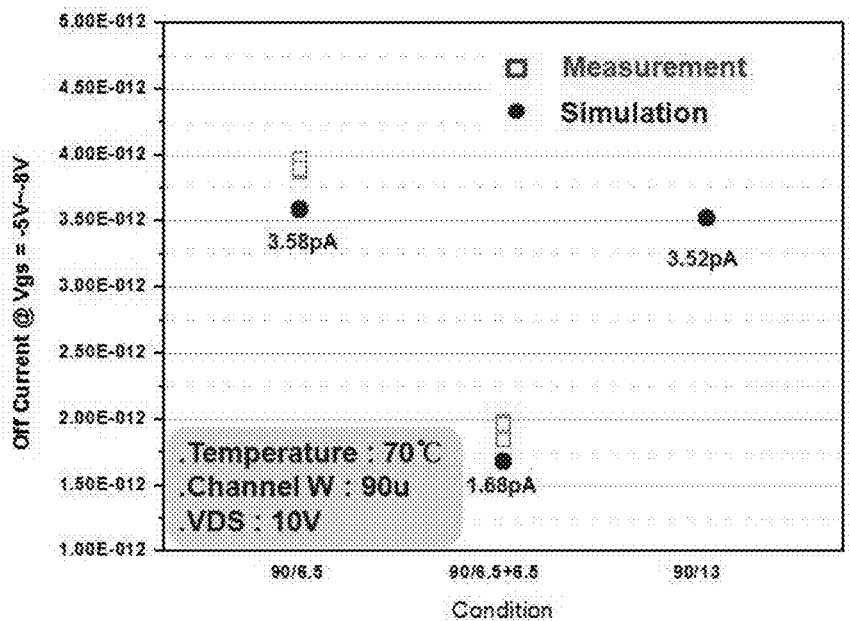
FIG. 18 is a diagram illustrating a difference in the off current between a dual gate structure and a single gate structure.

Referring to FIG. 17, the switching transistor ST may be formed to have a dual gate electrode structure. From FIG. 18, it may be seen that the off current of the switching transistor ST formed to have the dual gate electrode structure is 50% or more smaller than that of the driving transistor DT formed to have a single gate electrode structure. That is, the switching transistor ST in accordance with an embodiment of the present invention can reduce the off current using the switching transistor ST of a dual gate electrode structure.

As described above, in the aforementioned embodiments, a flicker can be improved by reducing the off current. In accordance with an embodiment of the present invention, the low-temperature polysilicon switching transistor ST has a lower unit off current than the low-temperature polysilicon driving transistor DT when the unit off current, that is, an off current per unit length of the channel of the low-temperature polysilicon switching transistor ST is compared with that of the low-temperature polysilicon driving transistor DT because the switching transistor ST and the driving transistor DT have different channel lengths.

The level of a flicker is in inverse proportion to capacitance of the storage capacitor Cs in addition to the off current. That is, a reduction of luminance attributable to the off current can be prevented because a voltage drop attributable to the off current can be reduced according to an increase of capacitance of the storage capacitor Cs.

Embodiments in which capacitance of the storage capacitor Cs has been improved in order to improve a flicker are described below.

Figure 19:
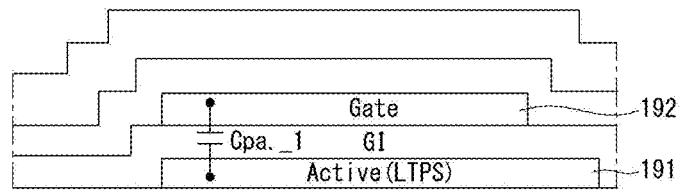
FIG. 19 is a diagram illustrating a first embodiment of a storage capacitor in accordance with an embodiment of the present invention.

FIG. 19 is a diagram illustrating a first embodiment of the storage capacitor Cs in accordance with an embodiment of the present invention.

Referring to FIG. 19, the storage capacitor Cs has a structure in which a first metal layer 191, a first insulating layer GI, and a second metal layer 192 are sequentially stacked. The first metal layer 191 may be formed by making conductive the same semiconductor layer as the active layer Active of the driving transistor DT and switching transistor ST. The second metal layer 192 may be formed of the same metal layer as the gate layer Gate of the driving transistor DT and switching transistor ST. The first insulating layer GI may be formed using the same insulating layer as an insulating layer that covers the active layer Active of the driving transistor DT and switching transistor ST.

The first insulating layer GI may be made of a substance having a high dielectric constant only in a region in which the storage capacitor Cs is formed. Hafnuium Dioxide HfO2 and Zirconium Dioxide ZrO2 is used to achieve high dielectric constant. Accordingly, the storage capacitor Cs according to the first embodiment has a higher capacitance. A flicker can be improved because the storage capacitor Cs according to the first embodiment has high capacitance as described above.

The gap between the first metal layer 191 and the second metal layer 192 may be narrow in order for the storage capacitor Cs according to the first embodiment to have high capacitance.

Figure 20:
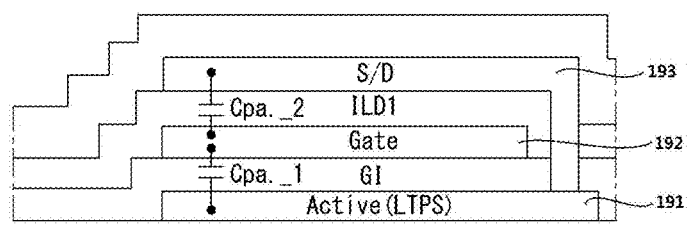
FIG. 20 is a diagram illustrating a second embodiment of the storage capacitor in accordance with an embodiment of the present invention.

FIG. 20 is a diagram illustrating a second embodiment of the storage capacitor Cs in accordance with an embodiment of the present invention.

Referring to FIG. 20, the storage capacitor Cs according to the second embodiment may include a first storage capacitor Cs and a second storage capacitor Cs stacked together. The first storage capacitor Cpa_1 may have a structure in which a first metal layer 191, a first insulating layer GI, and a second metal layer 192 are sequentially stacked. The first metal layer 191 may be formed of the same metal layer as the active layer of the driving transistor DT and switching transistor ST. The second metal layer 192 may be formed of the same metal layer as the gate layer Gate of the driving transistor DT and switching transistor ST. The first insulating layer GI may be formed of the same insulating layer that covers the active layer Active of the driving transistor DT and switching transistor ST. The second storage capacitor Cpa_2 may include a second metal layer 192, a second insulating layer ILD1, and a third metal layer 193. The second insulating layer ILD1 may be formed of the same insulating layer as an insulating layer that covers the gate Gate of the driving transistor DT and switching transistor ST. Furthermore, the third metal layer 193 may be made of the same metal layer as the source/drain electrode of the driving transistor DT and switching transistor ST.

The storage capacitor Cs according to the second embodiment has high capacitance because it includes the first and the second capacitors Cpa_1 and Cpa2 connected in parallel. Accordingly, the storage capacitor Cs according to the second embodiment can improve a flicker because it has high capacitance.

Figure 21:
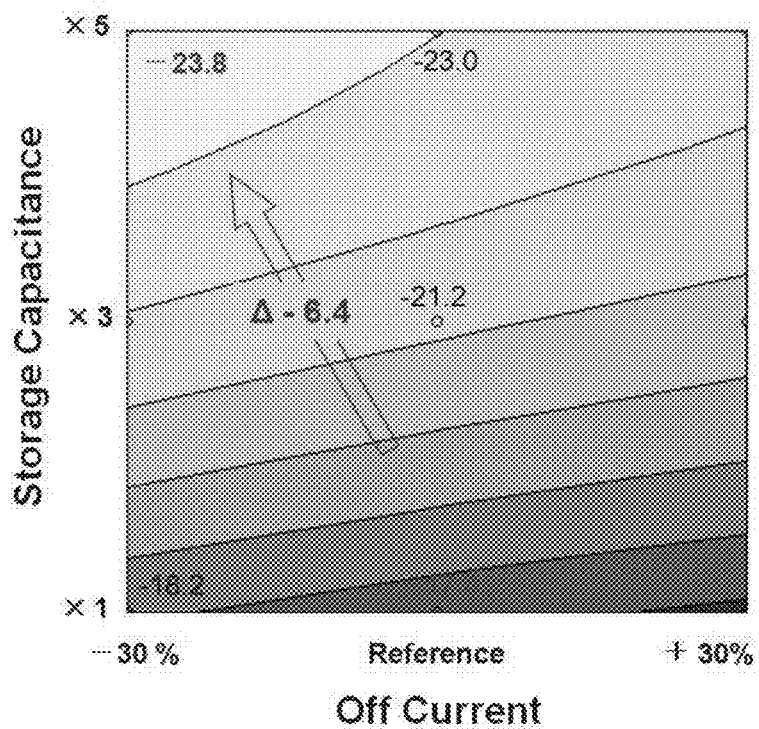
FIG. 21 is a diagram illustrating a change of the off current depending on the capacitance of a storage capacitor.

FIG. 21 is a diagram illustrating that a flicker is changed depending on the off current when capacitance of the storage capacitor Cs is three times "×3" to five times "×5" greater than capacitance "×1" of a common storage capacitor. From FIG. 21, it may be seen that a flicker is reduced as capacitance of the storage capacitor is increased and the off current is reduced.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode (OLED) display device comprising:
   an active matrix OLED array comprising a plurality of pixels arranged in a row and column structure, each pixel comprising an OLED, a driving transistor (DT) coupled to drive current through the OLED, a storage capacitor, and a switching transistor (ST) coupled to control charge on the storage capacitor corresponding to a data voltage for said pixel, wherein each driving transistor (DT) comprises:
      a DT active layer formed on a substrate, the DT active layer formed of a low-temperature polysilicon material;
      a DT source and a DT drain both formed in the DT active layer;
      a gate insulating layer formed on the DT active layer;
      a DT gate formed on the gate insulating layer above the DT active layer;
      an insulating layer formed above the DT gate;
   wherein each switching transistor (ST) comprises:
      a ST gate formed on the gate insulating layer, the ST gate at least partially covered by the insulating layer;
      a ST active layer formed on the insulating layer above the ST gate, the ST active layer formed of an oxide semiconductor material; and
      a ST source and a ST drain both contacting the ST active layer on opposite sides of the ST gate; and
   wherein each OLED comprises an anode electrically coupled to the DT source, and wherein the DT gate is electrically coupled to the ST source.

2. The OLED display device of claim 1, wherein the oxide semiconductor material is at least one selected from the group consisting of: zinc oxide (ZnO) and Gallium Indium Zinc Oxide (GIZO).

3. The OLED display device of claim 1, wherein both the DT gate and the ST gate are formed using a same metal layer.

4. The OLED display device of claim 1, wherein the DT further comprises:
   a first ILD formed on the DT gate;
   a second ILD formed on the first ILD; and
   wherein a third ILD is formed on the second ILD, and wherein the insulating layer is the third interlayer dielectric (ILD).

5. The OLED display device of claim 1, wherein the DT further comprises:
   a first ILD formed on the DT gate; and
   a second ILD formed on the first ILD; and wherein the insulating layer is the second interlayer dielectric (ILD).

6. The OLED display device of claim 1, wherein the insulating layer physically contacts the ST gate and the ST active layer.

7. The OLED display device of claim 1, wherein the storage capacitor of each pixel further comprises:
a first layer formed with a portion of the DT active layer;
a second layer formed with a portion of a metal layer, the metal layer also including the DT gate and the ST gate.

8. The OLED display device of claim 7, wherein the first layer and the second layer are separated by a portion of the gate insulating layer, wherein the portion of the gate insulating layer between the first and the second layers is formed with a substance having a high dielectric constant.

9. The OLED display device of claim 7, wherein each pixel further comprises:
a second storage capacitor comprising:
the second layer; and
a third layer formed with a portion of a second metal layer, the second metal layer also including the DT source electrode and the DT drain electrode.

10. The OLED display device of claim 9, wherein the second layer and the third layer are separated by a first interlayer dielectric (ILD) formed between the second layer and the third layer.

11. The OLED display device of claim 1,
wherein each driving transistor (DT) comprises:
a DT active layer formed on a substrate having a thickness d2, the DT active layer formed of a low-temperature polysilicon material;
a DT source and a DT drain both formed in the DT active layer;
a gate insulating layer having a height h1 formed on the DT active layer;
a DT gate having a channel width w1 formed on the gate insulating layer above the DT active layer;
an insulating layer formed on the DT gate;
wherein each switching transistor (ST) comprises:
a ST active layer formed on the substrate having thickness d1, the ST active layer formed of the low-temperature polysilicon material;
a ST source and a ST drain both formed in the DT active layer;
a ST gate having a channel width w2 formed on the gate insulating layer above the ST active layer, a portion of the insulating layer having a height h2 formed above the ST gate;
wherein OLED comprises an anode electrically coupled to the drain of the driving transistor, and wherein the DT gate is electrically coupled to the ST source; and
wherein at least one of the height h2, the depth d2, and the width w2 differs from the height h1, the depth d2, and the width w1, respectively.

12. The OLED display device of claim 11, wherein h2 is between 5-15% greater than h1.

13. The OLED display device of claim 11, wherein w1 is between 5-15% greater than w2.

14. The OLED display device of claim 11, wherein d1 is between 5-15% greater than d2.

15. The OLED display device of claim 11,
wherein the DT source and DT drain both comprise a first lightly doped drain (LDD) implantation of charge carriers i1;
wherein the ST source and the ST drain both comprise a second LDD implantation of charge carriers i2; and
wherein the concentration of charge carriers in i2 is lower than that in i1.

16. The OLED display device of claim 11, wherein the ST comprises dual gate structure, such that the ST gate comprises two physically separate portions, the ST active layer comprises two portions, and a portion of each active region on either side of both portions of the ST gate includes a lightly doped drain (LDD) implantation of charge carriers.

17. The OLED display device of claim 11, wherein both the DT gate and the ST gate are formed using a same metal layer.

18. The OLED display device of claim 11, wherein the DT further comprises:
a first ILD formed on the DT gate;
a second ILD formed on the first ILD; and
wherein a third ILD is formed on the second ILD, and wherein the insulating layer is the third interlayer dielectric (ILD).

19. The OLED display device of claim 11, wherein the DT further comprises:
a first ILD formed on the DT gate; and
a second ILD formed on the first ILD; and
wherein the insulating layer is the second interlayer dielectric (ILD).

* * * * *